(12) United States Patent
Kata et al.

(10) Patent No.: US 7,233,066 B2
(45) Date of Patent: Jun. 19, 2007

(54) MULTILAYER WIRING SUBSTRATE, AND METHOD OF PRODUCING SAME

(75) Inventors: Keiichiro Kata, Kanagawa (JP);
Hirokazu Honda, Kanagawa (JP);
Kazuhiro Baba, Kanagawa (JP);
Tadanori Shimoto, Kanagawa (JP);
Katsumi Kikuchi, Kanagawa (JP);
Rokuro Kambe, Nagoya (JP); Satoshi Hirano, Aichi (JP); Shinya Miyamoto, Aichi (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/411,020

(22) Filed: Apr. 26, 2006

(65) Prior Publication Data
US 2006/0189125 A1 Aug. 24, 2006

Related U.S. Application Data

(63) Continuation of application No. 10/454,530, filed on Jun. 5, 2003, now Pat. No. 7,060,604.

(30) Foreign Application Priority Data
Sep. 17, 2002 (JP) ............................. 2002-270225

(51) Int. Cl.
*H01L 23/48* (2006.01)
(52) U.S. Cl. ............................. 257/734; 257/E23.003; 257/700
(58) Field of Classification Search ............... 273/734; 257/700, 694, 772, E23.003, 734
See application file for complete search history.

(56) References Cited

U.S. PATENT DOCUMENTS

| 4,780,957 | A | | 11/1988 | Shiga et al. |
| 5,386,627 | A | | 2/1995 | Booth et al. |
| 5,527,741 | A | * | 6/1996 | Cole et al. ................. 438/107 |
| 5,918,153 | A | | 6/1999 | Morgan |
| 6,221,693 | B1 | | 4/2001 | Ho |
| 6,331,447 | B1 | | 12/2001 | Ho |
| 6,399,891 | B1 | * | 6/2002 | Kurita et al. ............... 174/256 |
| 2001/0013425 | A1 | | 8/2001 | Rokugawa et al. |
| 2002/0001937 | A1 | | 1/2002 | Kikuchi et al. |
| 2003/0161129 | A1 | | 8/2003 | Kusano et al. |

FOREIGN PATENT DOCUMENTS

EP 1 065 717 A2 1/2001

(Continued)

*Primary Examiner*—Caridad Everhart
(74) *Attorney, Agent, or Firm*—Sughrue Mion, PLLC

(57) ABSTRACT

A method of producing a multilayer wiring substrate is disclosed. The multilayer wiring substrate is free from a core substrate and includes a build up layer which includes an insulator layer and a wiring layer. One of a first main surface and a second main surface of the build up layer is formed with a metal supporting frame body. The method includes the steps of: forming a first insulator layer on a first main surface of a metal supporting plate, where the first insulator layer is included in the insulator layer and becomes a first resist layer which is positioned on the first main surface's side of the build up layer, and forming a first metal pad layer in a given position on a first main surface of the first insulator layer, where the first metal pad layer is included in the wiring layer and becomes a metal pad layer.

7 Claims, 10 Drawing Sheets

FOREIGN PATENT DOCUMENTS

| | | |
|---|---|---|
| EP | 1 091 406 A2 | 4/2001 |
| EP | 1091406 * | 11/2001 |
| JP | 11-233937 | 8/1999 |
| JP | 11-289025 | 10/1999 |
| JP | 2000-323613 A | 11/2000 |
| JP | 2001-177010 | 6/2001 |
| JP | 2002-26171 | 1/2002 |
| TW | 485746 | 5/2002 |

\* cited by examiner

MULTILAYER WIRING SUBSTRATE, AND METHOD OF PRODUCING SAME

CROSS-REFERENCE TO RELATED APPLICATION

This application is a Continuation of U.S. application Ser. No. 10/454,530 filed Jun. 5, 2003; now U.S. Pat. No. 7,060,604 the above-noted application incorporated herein by reference in its entirety.

BACKGROUND OF THE INVENTION

1. Field of the Invention

The present invention relates to a multilayer wiring substrate and a method of producing the multilayer wiring substrate which is applicable to a package substrate incorporating electronic parts. More specifically, the present invention relates to the method of producing the multilayer wiring substrate which is free of a core substrate and has a metal supporting frame body formed on one of main surfaces of a build up layer.

2. Description of the Related Art

Recently, speed of digital product is more and more increased remarkably. According to the above high speed trend, the package substrate used for the digital product is getting smaller and having the increased number of connecter terminals (pins), so as to meet high integration as well as high density of electronic parts including LSI (=Large Scale Integration), IC (=Integrated Circuit) chip and chip capacitor which are mounted on the package substrate. This signifies the need for high wiring density of the package substrate.

For producing the package substrate with high wiring density, a build up layer method attracts attention recently. With layer-to-layer insulator films made of resin material, the build up layer method forms a laminated insulator layer on a core substrate. Then, the thus laminated insulator layer is overlapped with a wiring layer, thus forming a multilayer constitution so as to finally form the build up layer.

Japanese Patent Unexamined Publication No. Heisei 11 (1999)-233937 (=JP11-233937) and Japanese Patent Unexamined Publication No. Heisei 11 (1999)-289025 (=JP11-289025) disclose a wiring substrate having a build up layer on a core substrate.

Although bringing about the high density wiring, the build up layer formed through the above build up layer method can no longer keep pace with the demanded speed of the above digital product. This is attributable to the core substrate which is a member for compensating the build up layer for mechanical strength.

More specifically described as below:

Case 1: Provided that the core substrate is mounted in the package substrate, a space (or area) occupied by forming the core substrate is so designed as to be useless for the high density wiring of the package substrate. This uselessness may hinder still higher density wiring of the package substrate.

Case 2. The electric signal for the increased speed of the digital product may become as high as some G (giga) Hz in frequency. With the high frequency of the electric signal, the wiring connecting the drive source (of the electronic parts mounted in the package substrate) and the electronic parts may contribute as an inductance, thus rendering the wiring length considerable. In other words, thickness of the core substrate is not ignorable.

Without formation of the core substrate, a new type of package substrate has been proposed having the feature of the build up layer which enables high density wiring.

FIG. 5 shows the new type of package substrate having the above feature. There is formed a build up layer 80 including a wiring layer 110 and an insulator layer 90. A core substrate for compensating the build up layer 80 for mechanical strength is not shown in FIG. 5. Replacing the core substrate, a metal supporting frame body 70 formed on one (upper in FIG. 5) of main surfaces of the build up layer 80 compensates the build up layer 80 for the mechanical strength. The main surface (lower in FIG. 5) of the build up layer 80 is formed with a first metal pad layer 40, while the main surface (upper in FIG. 5) of the build up layer 80 is formed with a second metal pad layer 65. Each of the first metal pad layer 40 and the second metal pad layer 65 included in the build up layer 80 has an exposed surface. Hereinabove, the second metal pad layer 65 on the main surface (upper in FIG. 5) of the build up layer 80 becomes a connector terminal for mounting the electronic parts. On the other hand, the first metal pad layer 40 on the main surface (lower in FIG. 5) of the build up layer 80 becomes a connector terminal to be mounted, for example, on a mother board.

Hereinafter in the specification of the present invention, the package substrate having no core substrate and having the build up layer as a multilayer wiring layer is referred to as "multilayer wiring substrate."

Japanese Patent Unexamined Publication No. 2002-26171 (=JP2002-026171) discloses a multilayer wiring substrate like the one in FIG. 5.

Adopting the multilayer wiring substrate for the package substrate (see typical drawing in FIG. 5) can bring about still higher density wiring, although leaving the following inconveniences.

The metal supporting frame body in FIG. 5 is so formed as to compensate the build up layer for the mechanical strength. Unlike the core substrate according to Japanese Patent Unexamined Publication No. Heisei 11 (1999)-233937 (=JP11-233937) and Japanese Patent Unexamined Publication No. Heisei 11 (1999)-289025 (=JP11-289025), the metal supporting frame body in FIG. 5 does not coat an entire region of the build up layer. Thereby, applying an external force is likely to cause concentrated stress to an area in the vicinity of an interface between the wiring layer and the insulator layer of the build up layer.

Referring to the typical drawing in FIG. 5, the second metal pad layer 65 with the exposed surface has such a small contact area with the insulator layer 90 as to cause a failure (including cracks and the like) to the second metal pad layer 65 when concentrated stress is applied. In addition, applying the concentrated stress in production steps to the area in the vicinity of the interface between the wiring layer and the insulator layer of the build up layer may also cause the cracks and the like.

As described above, the failure including the cracks and the like caused to the area in the vicinity of the interface between the wiring layer and the insulator layer of the build up layer may be responsible for lowered quality of the build up layer, including electrical characteristic and so on. The failure becoming great may cause defective product.

BRIEF SUMMARY OF THE INVENTION

It is an object of the present invention to provide a method of producing a multiplayer wiring substrate having a build up layer as a multilayer wiring layer, wherein the multilayer wiring substrate is free of a core substrate.

It is another object of the present invention to improve quality of the build up layer of the multilayer wiring substrate, including electrical characteristic.

It is still another object of the present invention to render the production method of the multilayer wiring substrate proper for producing the build up layer.

The other objects and features of the present invention will become understood from the following description with reference to the accompanying drawings.

According to an aspect of the present invention, there is provided a method of producing a multilayer wiring substrate. The multilayer wiring substrate is free from a core substrate and comprises a build up layer. The build up layer comprises an insulator layer and a wiring layer. One of a first main surface and a second main surface of the build up layer is formed with a metal supporting frame body. The method comprising the following steps of:

i) forming a first insulator layer substantially on a first main surface of a metal supporting plate. The first insulator layer is included in the insulator layer and becomes a first resist layer which is positioned on the first main surface's side of the build up layer, and ii) forming a first metal pad layer in a given position on a first main surface of the first insulator layer. The first metal pad layer is included in the wiring layer and becoming a metal pad layer.

A first feature of the method of producing the multilayer wiring substrate according to the aspect of the present invention is described in the typical drawing in FIG. 4(a) and can be described as below:

<1st sub-step of step 1 for forming first insulator layer>:

Substantially on a first main surface PF1 of a metal supporting plate, there is formed a first insulator layer 3 included in an insulator layer. The first insulator layer 3 is a first resist layer which is positioned on a first main surface's side of the build up layer.

<2nd sub-step of step 1 for forming first metal pad layer>:

Thereafter, a first metal pad layer 4 included in a wiring layer is formed. The first metal pad layer 4 becomes a metal pad layer which is formed on a given position of a first main surface PF2 of the first insulator layer 3.

According to the related art shown by the typical drawing in FIG. 6(a), a first metal pad layer 4' and an insulator layer 10 are so formed as to allow a first main surface PF1 (of a metal supporting plate 2') and the first metal pad layer 4' to form an interface therebetween.

With the above constitution, a wiring layer 11 and the insulator layer 10 are then sequentially formed, thus forming a multilayer constitution, as is seen in FIG. 6(b)-I and FIG. 6(b)-II.

Thereafter, as is seen with a typical drawing in FIG. 6(b)-I, an area constituting the metal supporting plate 2' is partly removed in such a manner that a main surface on the metal supporting plate [2']'s side of the first metal pad layer 4' is partly exposed (for avoiding confusion between 2 and 2', [2'] above is bracketed).

Otherwise, as is seen with a typical drawing in FIG. 6(b)-II, the area constituting the metal supporting plate 2' is substantially entirely removed in such a manner that the main surface on the metal supporting plate [2']'s side of the first metal pad layer 4' is substantially entirely exposed (for avoiding confusion between 2 and 2', [2'] above is bracketed).

In the removing step of the production shown by each of FIG. 6(b)-I and FIG. 6(b)-II, or, after the removing step of the production shown by each of FIG. 6(b)-I and FIG. 6(b)-II, an external force is likely to be concentrated especially on the interface between the first metal pad layer 4' and the insulator layer 10, thereby, the failure including the cracks and the like is likely to be caused to the area in the vicinity of a region F in each of FIG. 6(b)-I and FIG. 6(b)-II.

Under the present invention, however, as is seen in FIG. 4(a), forming the first insulator layer 3 substantially on the first main surface PF1 of the metal supporting plate 2 and forming the first metal pad layer 4 in a given position on the first main surface PF2 of the first insulator layer 3 can effectively prevent the failure including the cracks and the like described above. As is seen in FIG. 4(b)-I and FIG. 4(b)-II, the insulator layer 10 defining the interface with the first metal pad layer 4 is newly formed for multilayer constitution.

Thereafter, as is seen with a typical drawing in FIG. 4(b)-I, an area constituting the metal supporting plate 2 is partly removed in such a manner that a main surface on the metal supporting plate 2's side of the first metal pad layer 4 is partly exposed.

Otherwise, as is seen with a typical drawing in FIG. 4(b)-II, the area constituting the metal supporting plate 2 is substantially entirely removed in such a manner that the main surface on the metal supporting plate 2's side of the first metal pad layer 4 is substantially entirely exposed.

In the removing step of the production shown by each of FIG. 4(b)-I and FIG. 4(b)-II, or, after the removing step of the production shown by each of FIG. 4(b)-I and FIG. 4(b)-II, the external force is less likely to be concentrated especially on the interface between the first metal pad layer 4 and the insulator layer 10. In other words, the concentration of the external force can be relieved.

More specifically, the above relieved concentration of the external force is described as below:

The first metal pad layer 4's area contacting the insulator layer 10 (including the first insulator layer 3) in FIG. 4(b)-I and FIG. 4(b)-II can be secured more extensively than the first metal pad layer [4']'s area contacting the insulator 10 in FIG. 6(b)-I and FIG. 6(b)-II (for avoiding confusion between the first metal pad layer 4 and the first metal pad layer 4', [4'] above is bracketed).

Hereinabove, the area constituting the metal supporting plate 2 partly removed in FIG. 4(b)-I is to be reused for the metal supporting frame body of the multilayer wiring substrate (final product).

As described above, the first insulator layer formed through the 1st sub-step of step 1 for forming the first insulator layer is to become a first resist layer which becomes a resist layer on the multilayer wiring substrate (final product), thus causing no influence on the production efficiency. On the other hand, the first metal pad layer formed through the 2nd sub-step of step 1 for forming the first metal pad layer is to become a connector terminal {of the multilayer wiring substrate (final product)} for mounting the electronic parts or a connector terminal {of the multilayer wiring substrate (final product)} to be mounted on the mother board and the like.

<Etching step>

In the method of producing the multilayer wiring substrate under the present invention, the metal supporting plate is subjected to an etching step for an etching treatment. In the etching treatment, the first insulator layer is used as an etch stop layer. As described above, the area constituting the metal supporting plate is subjected to the partly removing step {FIG. 4(b)-I} otherwise the entirely removing step {FIG. 4(b)-II}. In other words, under the present invention, the removing step of the metal supporting plate is carried out with the etching treatment whether partly or entirely. Mechanical grinding such as a plane grinding machine can also remove the metal supporting plate. For removing the metal supporting plate smoothly, conveniently and selectively, however, a chemical polishing, that is, the etching treatment is preferred. The mechanical grinding bringing about an unintentional vibration may cause concentrated stress to the interface between the insulator layer and the wiring layer. Therefore, the etching treatment is preferable for removing the metal supporting plate.

Moreover under the present invention, the first insulator layer can become the etch stop layer. In FIG. 6(b)-I and FIG. 6(b)-I, at least the following materials are to be selected in view of etching selectivity:

1. Material of a surface layer on the metal supporting plate [2']'s side of the first metal pad layer 4' (for avoiding confusion between 2 and 2', [2'] above is bracketed), and 2. Material of the metal supporting plate 2'.

The present invention is, however, free from the above etching selectivity. For example, the first metal pad layer can be made of one material and formed into a single layer. Moreover, the first metal pad layer can be the same in material as the metal supporting plate. In other words, in terms of the etching selectivity, the present invention can eliminate the following need of the first metal pad plate:

At least a surface layer on the metal supporting plate's side of the first metal pad layer is made of a material having the etching selectivity relative to the metal supporting plate.

Moreover under the present invention, combination of materials between the metal supporting plate and the first metal pad layer can be widened, thus improving working efficiency and working convenience.

As described above, the removing step of the metal supporting plate 2 is carried out through the etching step that is the etching treatment with the first insulator layer 3 as the etch stop layer, thus removing the metal supporting plate 2 with ease. Moreover in this case, the first insulator layer 3 is made of resin material. With this, the etching selectivity can be basically considered between the resin material and the metal, instead of metal-to-metal as described referring to FIG. 6(b)-I and FIG. 6(b)-II above. Properly selecting the type of etching gas and etching liquid can securely etch the metal supporting plate 2 only. The etching method includes dry etching and wet etching. In view of cost, however, the wet etching using the etching liquid is preferred.

In the method of producing the multilayer wiring substrate under the present invention, the first insulator layer is subjected to an opening treatment. The first insulator layer is opened in a first opening step for opening a given position of the first insulator layer in such a manner that the main surface on the first insulator layer's side of the first metal pad layer includes a coated region coated with the first insulator layer and an exposed region having an exposed surface.

As described above, the first metal pad layer becomes the connector terminal for mounting the electronic parts or the connector terminal to be mounted on the mother board. Therefore, the first insulator layer is subjected to the opening treatment in such a manner that at least a part of the surface on the first insulator layer's side of the first metal pad layer 4 is exposed. The given position of the first insulator layer corresponding to a position where the first metal pad layer is formed is to be subjected to a opening step. The opening step can be largely categorized into the one shown in FIG. 7(a) and the one in FIG. 7(b). FIG. 7(a) is a typical drawing showing that the main surface on the first insulator layer's side of the first metal pad layer includes the coated region coated with the first insulator layer and the exposed region having the exposed surface. On the other hand, FIG. 7(b) is a typical drawing showing that the main surface on the first insulator layer's side of the first metal pad layer is substantially entirely exposed.

A first main surface of the first metal pad layer 4 in FIG. 7(a) including the coated region coated with the first insulator layer 3 and the exposed region having the exposed surface can, as compared with the first metal pad layer 4 in FIG. 7(b), secures greater contact area of the insulator layer 10 {including the first insulator layer 3} with the first metal pad layer 4. With this, the first main surface of the first metal pad layer 4 in FIG. 7(a) can prevent the external force (which may be caused in the production) from concentrating in the area in the vicinity of the interface between the insulator layer 10 and the first metal pad layer 4, thus preventing effectively cracks and the like from being caused to the area in the vicinity of the interface between the insulator layer 10 and the first metal pad layer 4. Then, the multiplayer wiring substrate (final product) produced through the method under the present invention is to mount the electronic parts and the like or to be mounted on the mother board and the like.

In this case, the first metal pad layer 4 becomes the contact terminal via a solder bump, a solder ball and the like. Therefore, the stress may be caused especially to the area in the vicinity of the interface between the first metal pad layer 4 and the insulator layer 10 in the occasions including:

1. in a process of forming the solder bump, the solder ball and the like on the first metal pad layer.

2. in a process of mounting the electronic parts and the like.

3. after mounting the electronic parts and the like.

With the constitution in FIG. 7(a) however, the above failure is supposed to be suppressed effectively.

In sum, the first opening step for opening the first insulator layer is preferred to be as follows:

The given position of the first insulator layer is opened in such a manner that the main surface on the first insulator layer's side of the first metal pad layer includes the coated region coated with the first insulator layer and the exposed region having the exposed surface.

The dry etching is preferably used for opening the first insulator layer in the above first opening step, thus rendering the opening easy and securely finishing the opened void space with a preferred diameter and configuration. Herein, the first insulator layer is a layer-to-layer insulator film which has been subjected to a cure treatment before the first opening step. The following steps, for example, are not applicable to the first insulator layer:

Use light sensitive material for the layer-to-layer insulator film of the first insulator layer. Open the first insulator layer by a photo-via forming method which is the wet etching method. Subject the first insulator layer to the cure treatment.

Therefore, the dry etching used herein includes known methods such as laser machining, plasma etching, ion beam etching and the like. Presently, as the most technically established method and for finishing with ease the diameter and configuration of the opened void space, the laser machining is preferred. In view of laser's wave length and the like, a known laser including excimer laser, carbon dioxide laser, YAG (Yttrium Aluminum Garnet) laser and the like is to be properly selected corresponding to the diameter and depth of the opened void space.

The method of producing the multilayer wiring substrate under the present invention further includes:

i) forming a second insulator layer included in the insulator layer and becoming a second resist layer which is positioned on a second main surface's side of the build up layer opposite to the first main surface's side of the build up layer, ii) forming, prior to the forming step of forming the second insulator layer, a second metal pad layer substantially beneath the second insulator layer, the second insulator layer being included in the wiring layer and becoming the metal pad layer, and iii) a second opening step of;
subjecting the second insulator layer to an opening treatment, and
opening a given position of the second insulator layer in such a manner that a main surface on the second insulator layer's side of the second metal pad layer includes a coated region coated with the second insulator layer and an exposed region having an exposed surface.

The first insulator layer as described above becomes the first resist layer which is positioned on the first main surface's side of the build up layer. On the second main surface's side of the build up layer opposite to the first main surface's side of the build up layer, there is also formed a second resist layer. The second insulator layer becoming the second resist layer is thus formed (step of forming second insulator layer). Prior to the step of forming the second insulator layer, the second metal pad layer included in the wiring layer and becoming the metal pad layer is formed substantially beneath the second insulator layer (step of forming second metal pad layer). Like the first metal pad layer, the second metal pad layer also becomes the connector terminal for mounting the electronic parts or the connector terminal to be mounted on the mother board. Hereinabove however, one of the first metal pad layer and the second metal pad layer is for mounting the electronic parts while the other of the first metal pad layer and the second metal pad layer is mounted on the mother board.

Formation of the second metal pad layer through the step of forming the second metal pad layer and formation of the second insulator layer through the step of forming the second insulator layer are described above. Then, the subsequent second opening step of opening the second insulator layer can render the given position of the second insulator layer in such that the main surface on the second insulator layer's side of the second metal pad layer includes a coated region coated with the second insulator layer and the exposed region having the exposed surface.

With the second opening step carried out as described above, the second metal pad layer 6 and the second insulator layer 5 are formed as shown by the typical drawing in FIG. 8, like the first metal pad layer 4 and the first insulator layer 3 are formed as shown by the typical drawing in FIG. 7(a). In sum, the contact area of the insulator layer 10 (including the second insulator layer 5 with the second metal pad layer 6 can be secured extensively, thus preventing the external force (which may be caused in the production) from concentrating in the area in the vicinity of the interface between the insulator layer 10 and the second metal pad layer 6, and further thus effectively preventing the cracks and the like from being caused to the area in the vicinity of the interface between the insulator layer 10 and the second metal pad layer 6.

Hereinabove, the stress may be caused especially to the area in the vicinity of the interface between the second metal pad layer and the insulator layer in the occasions including:

1. in a process of forming the solder bump, the solder ball and the like on the second metal pad layer.
2. in a process of the second metal pad layer mounting the electronic parts and the like.
3. after the second metal pad layer mounting the electronic parts and the like.
4. in a process of the second metal pad layer being mounted on the mother board and the like.
5. after the second metal pad layer being mounted on the mother board and the like.

With the constitution in FIG. 8 however, the failure is supposed to be suppressed effectively.

The dry etching (including the laser machining, the plasma etching, the ion beam etching and the like) is usable for opening the second insulator layer in the above second opening step. The following method is, however, also applicable to the dry etching:

At first, allow the second insulator layer subjected to the step of forming the second insulator layer to include the layer-to-layer insulator film made of the light sensitive material. In the step of forming the second insulator layer, the cure treatment is omitted. In other words, the cure treatment-free layer-to-layer insulator film (light sensitive material) is regarded as the second insulator layer. In the second opening step, irradiation, exposure and development with ultra violet ray to a given position of the second insulator layer can open a void space in the known photo-via forming method. Use of the photo-via forming method involves the cure treatment on the second insulator layer in the step of opening the second insulator layer or after opening the second insulator layer.

The package substrate including the multilayer wiring substrate under the present invention defines the following two terminal-to-terminal distances:

1. A distance A is defined between the connecter terminals for mounting the electronic parts on the multilayer wiring substrate.
2. A distance B is defined between the connector terminals for mounting the multilayer wiring substrate on the mother board.

Ordinarily, the distance A is shorter than the distance B attributable to a distance between connector terminals of the electronic parts. Thereby, a pad area (main surface) of the metal pad layer on the electronic parts' side is smaller than a pad area (main surface) of the metal pad layer on the mother board's side. Accordingly, the opened and exposed region on the main surface of the metal pad layer on the electronic parts' side is smaller than the opened and exposed region on the main surface of the metal pad layer on the mother board's side.

Summarizing the above, in the method of producing the multilayer wiring substrate under the present invention, the exposed region of the first metal pad layer formed through the first opening step is smaller than the exposed region of the second metal pad layer formed through the second opening step. Moreover, the first opening step uses the dry etching. Hereinabove, the dry etching includes the known etchings including the laser machining, the plasma etching, the ion beam etching and the like. Among the above etchings, the laser machining is preferable for the reason described above, namely (repeatedly), as the most technically established method and for finishing with ease the diameter and configuration of the opened void space.

As described above, in the first opening step, the dry etching is preferred for opening the given position of the first insulator layer. More specifically, the opening method with the laser machining, the plasma machining, the ion beam etching is more effective than the photo-via forming method especially for reducing in size the opened diameter. Herein, the exposed region of the first metal pad layer formed through the first opening step is smaller than the exposed region of the second metal pad layer through the second opening step, thus using the first metal pad layer for the connector terminal for mounting the electronic parts. Moreover, the first opening step cannot use the photo-via forming method that can contribute to improvement of working efficiency by facilitating the opening and then carrying out the cure treatment of the layer-to-layer insulator film. As a result, the first opening step uses the dry etching in such a manner as to preferably obtain as much good features of the dry etching as possible. Therefore, using the first metal pad layer for the connector terminal for mounting the electronic parts can, according to reduction in terminal-to-terminal distance of the electronic parts, form the properly exposed region of the first metal pad layer in the first opening step of opening the first insulator layer.

The first metal pad layer used for the connector terminal for mounting the electronic parts has the main surface on the first insulator layer's side of the first metal pad layer preferably in a range from 2,800 $\mu m^2$ to 32,000 $\mu m^2$. The main surface of the first metal pad layer shaped substantially into a circle, however, may have the diameter in a range from 60 $\mu m$ to 200 $\mu m$ (for calculating the circular area, all numerals are expressed in two effective digits, and include a numerical range after round off). The main surface on the first insulator layer's side of the first metal pad layer is to be determined in light of the terminal-to-terminal distance of the present electronic parts as well as design limit. The main surface on the first insulator layer's side of the first metal pad layer over 32,000 $\mu m^2$ may be responsible for insufficient minimum distance between the first metal pad layers, thus causing possible electrical short circuit. On the other hand, the main surface on the first insulator layer's side of the first metal pad layer below 2,800 $\mu m^2$ may not sufficiently secure, in the first opening step, the coated region {of the first metal pad layer} coated with the first insulator layer.

With the above limited area of the main surface on the first insulator layer's side of the first metal pad layer, the exposed region of the first metal pad layer exposed after the first opening step is preferably in a range from 1,900 $\mu m^2$ to 26,000 $\mu m^2$. In the case of the exposed region shaped substantially into the circle, however, the diameter of the exposed region is preferably in a range from 50 $\mu m$ to 180 $\mu m$ (for calculating the circular area, all numerals are expressed in two effective digits, and include a numerical range after round off).

The exposed region of the first metal pad layer over 26,000 $\mu m^2$ may not secure, in the first opening step, the coated region {of the first metal pad layer} coated with the first insulator layer.

On the other hand, the exposed region of the first metal pad layer below 1,900 $\mu m^2$ may be responsible for too small a void diameter of the first insulator layer in the first opening step. With this, securing void space depth with ease may not be achieved due to a focal depth of the laser, thus decreasing the working efficiency.

The second metal pad layer used for the connector terminal to be mounted on the mother board and the like has the main surface on the second insulator layer's side of the second metal pad layer preferably in a range from 49,000 $\mu m^2$ to 600,000 $\mu m^2$. The main surface of the second metal pad layer shaped substantially into a circle may, however, have the diameter in a range from 250 $\mu m$ to 870 $\mu m$ (for calculating the circular area, all numerals are expressed in two effective digits, and include a numerical range after round off). The main surface on the second insulator layer's side of the second metal pad layer is to be determined in light of the terminal-to-terminal distance as well as design limit of the present mother board, namely, in light of the side on which the multilayer wiring substrate is mounted. The main surface on the second insulator layer's side of the second metal pad layer over 600,000 $\mu m^2$ may be responsible for insufficient minimum distance between the second metal pad layers, thus causing possible electrical short circuit. On the other hand, the main surface on the second insulator layer's side of the second metal pad layer below 49,000 $\mu m^2$ may not sufficiently secure, in the second opening step, the coated region {of the second metal pad layer} coated with the second insulator layer.

With the above limited area of the main surface on the second insulator layer's side of the second metal pad layer, the exposed region of the second metal pad layer exposed after the second opening step is preferably in a range from 30,000 $\mu m^2$ to 400,000 $\mu m^2$. In the case of the exposed region shaped substantially into the circle, however, the diameter of the exposed region is preferably in a range from 200 $\mu m$ to 710 $\mu m$ (for calculating the circular area, all numerals are expressed in two effective digits, and include a numerical range after round off).

The exposed region of the second metal pad layer over 400,000 $\mu m^2$ may not secure, in the second opening step, the coated region {of the second metal pad layer} coated with the second insulator layer. On the other hand, the exposed region of the second metal pad layer below 30,000 $\mu m^2$ may be responsible for too small a void diameter of the second insulator layer in the second opening step. With this, securing void space depth with ease may not be achieved even with the laser (not to say, with the photo-via forming method), thus decreasing the working efficiency.

BRIEF DESCRIPTION OF THE SEVERAL VIEWS OF THE DRAWINGS

FIG. 4 explains an effect of forming a first insulator layer 3 under the present invention, in which;

FIG. 4(*a*) shows a first feature of the method of forming a first insulator layer 3, FIG. 4(*b*)-I shows that an area constituting a metal supporting plate 2 is partly removed, and FIG. 4(*b*)-II shows that the area constituting the metal supporting plate 2 is substantially entirely removed.

FIG. 6 explains an effect of forming an insulator layer 10 according to the related art, as compared with the first insulator layer 3 in FIG. 4 under the present invention, in which;

FIG. 6(b)-I shows that an area constituting a metal supporting plate 2' is partly removed, and FIG. 6(b)-II shows that the area constituting the metal supporting plate 2' is substantially entirely removed.

FIG. 7 explains formation of the first insulator layer 3 and the first metal pad layer 4 under the present invention, in which;

DETAILED DESCRIPTION OF THE EMBODIMENT

In the following, various embodiments of the present invention will be described in detail with reference to the accompanying drawings.

For ease of understanding, the following description will contain various directional terms, such as, left, right, upper, lower, forward, rearward and the like. However, such terms are to be understood with respect to only a drawing or drawings on which the corresponding part of element is illustrated.

—1st Embodiment—

Figure 1:
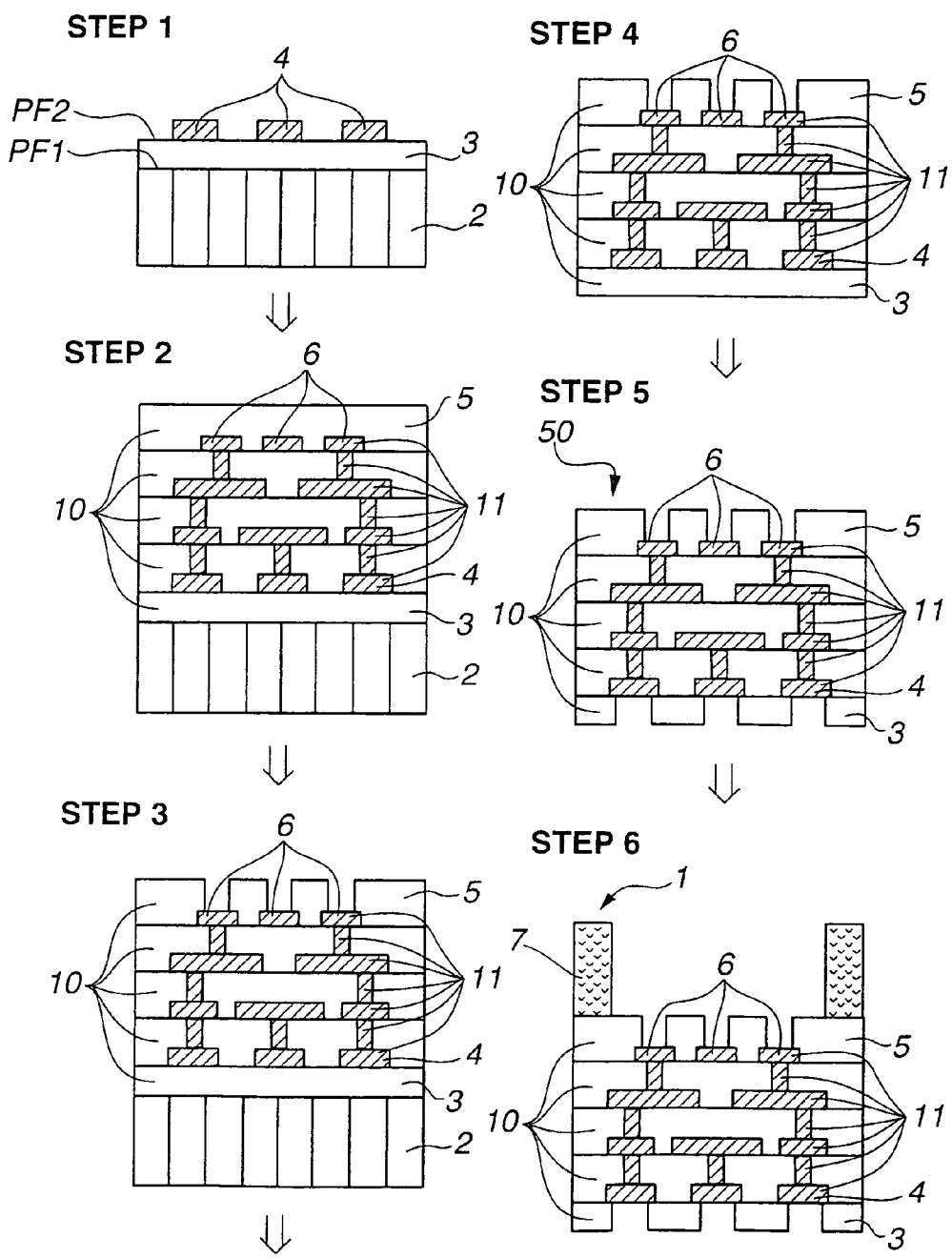
FIG. 1 shows steps of a method of producing a multilayer wiring substrate 1, according to a 1st embodiment of the present invention.

As is seen in FIG. 1, there is provided a method of producing a multilayer wiring substrate 1 according to a 1st embodiment (basic embodiment) of the present invention.

<Step 1>

{1st sub-step of step 1 of forming first insulator layer}

Substantially on a first main surface PF1 of a metal supporting plate 2, a layer-to-layer insulator film is laminated (attached together) to be subjected to a cure treatment, to thereby form a first insulator layer 3 (having a thickness, for example, 30 µm).

Hereinabove, the material used for forming the metal supporting plate 2 includes Cu, Cu alloy, SUS (pursuant to JIS, where JIS stands for Japanese Industrial Standard), Fe—Ni alloy, Al, Al alloy, invar, invar alloy and the like. The layer-to-layer insulator film for forming the first insulator layer 3 is preferred to be made of known material including a light sensitive resin, a thermosetting resin and the like. The thermosetting resin is, however, more preferable for forming the first insulator layer 3, in light of an after-described first opening step which uses, especially, a laser for opening the first insulator layer 3.

Moreover, the thermosetting resin includes, for example, polyimide derivative or epoxy derivative.

{2nd sub-step of step 1 of forming first metal pad layer}

As is seen in the step 1, thereafter, a first metal pad layer 4 (having a thickness, for example, 15 µm) is formed by Cu plating in a given position of a first main surface PF2 of the first insulator layer 3.

<Step 2>

On the first metal pad layer 4, thereafter, the layer-to-layer insulator film is laminated to be subjected to the cure treatment, to thereby form an insulator layer 10 (having a thickness, for example, 30 µm). Thereafter, a wiring layer 11 (having a thickness, for example, 15 µm) is formed by Cu plating in a given position of a surface of the insulator layer 10. Moreover, opening (for example, with the laser) a given position of the insulator layer 10 forms a via conductor which is included in the wiring layer 11 by the Cu plating. After the formation of the via conductor, the wiring layer 11 and the first metal pad layer 4 can make the layer-to-layer coupling on the insulator layer 10. Forming likewise sequentially thereafter, the insulator layer 10 and the wiring layer 11 for the multilayer constitution forms an laminated body, as is seen in the step 2 in FIG. 1.

{2nd sub-step of step 2 of forming second insulator layer}

The thus obtained laminated body has its outermost (uppermost) layer which becomes a second insulator layer 5 (having a thickness, for example, 30 µm) to be formed in a 2nd sub-step of step 2 forming the second insulator layer 5 according to the 1st embodiment.

{1st sub-step of step 2 of forming second metal pad layer}

Substantially beneath the second insulator layer 5, there is formed a second metal pad layer 6 (having a thickness, for example, 15 µm) to be formed in a 1st sub-step of step 2 for forming the second metal pad layer 6.

<Step 3>

Thereafter, open a given position of the second insulator layer 5 with the laser in a second opening step described as below:

Second opening step: Forming a constitution in which a main surface on the second insulator layer 5's side of the second metal pad layer 6 includes a coated region coated with the second insulator layer 5 and an exposed region having an exposed surface.

A photo-via forming method can replace the laser in the second opening step. In this case, however, the photo-via forming method is supposed to skip the cure treatment at the step 2, by using the layer-to-layer resin made of at least the light sensitive material. In the step 3, the second insulator layer 5 after mask treatment is to be subjected to irradiation, exposure and development with ultra violet ray, to thereby form the above constitution after the second opening step (namely, the constitution in which the main surface on the second insulator layer 5's side of the second metal pad layer 6 includes the coated region coated with the second insulator layer 5 and the exposed region having an exposed surface). Moreover, use of the photo-via forming method subjects the second insulator layer 5 to the cure treatment after opening the second insulator layer 5 or in the process of opening the second insulator layer 5.

<Step 4>

The metal supporting plate 2 is subjected to an etching treatment (etching step) for selectively etching (removing) the metal supporting plate 2 with a wet etching (etching liquid). In the etching step, the first insulator layer 3 becomes an etch stop layer. Hereinabove, an etching resist (not shown in FIG. 1) is formed on a surface of the second insulator layer 5, thus protecting the second metal pad layer 6 from the etching liquid.

The etching liquid for the etching step has different selectivity between the material of the metal supporting plate 2 and the material of first insulator layer 3. Greater etching electivity is preferred for use of the etching step.

<Step 5>

Thereafter, open a given position of the first insulator layer 3 with the laser in a first opening step described as below:

First opening step: Forming a constitution in which a main surface on the first insulator layer 3's side of the first metal pad layer 4 includes a coated region coated with the first insulator layer 3 and an exposed region having an exposed surface.

After the first opening step, the exposed area of each of the first metal pad layer 4 and the second metal pad layer 6 is subjected to non-electrolytic Ni—P plating (not shown in FIG. 1) and an Au plating (not shown in FIG. 1), thus forming a build up layer 50 including the wiring layer 11 (including the first metal pad layer 4 and the second metal pad layer 6) and the insulator layer 10 (including the first insulator layer 3 and the second insulator layer 5).

According to the 1st embodiment, the second insulator layer 5 is formed. The second insulator layer 5 becomes a second resist layer in the build up layer 50. On the other hand, the first insulator layer 3 becomes a first resist layer. Moreover, one of the first metal pad layer 4 and the second metal pad layer 6 is the connector terminal for mounting the electronic parts, while the other of the first metal pad layer 4 and the second metal pad layer 6 is the connector terminal to be mounted on the mother board or other wiring substrate.

<Step 6>

According to the 1st embodiment, the second metal pad layer 6 is used for the connector terminal for mounting the electronic parts.

A metal supporting frame body 7 is formed in a given position of the second insulator layer 5. The metal supporting frame body 7 is made of metal material including Cu, Cu alloy, SUS (pursuant to JIS, where JIS stands for Japanese Industrial Standard), Fe—Ni alloy, Al, Al alloy, invar, invar alloy and the like.

The multilayer wiring substrate 1 can be formed in the above step 1, step 2, step 3, step 4, step 5 and step 6. The thus formed multilayer wiring substrate 1 is used as the package substrate. Therefore, the second metal pad layer 6 is electrically connected to the electronic parts by way of a solder bump, while the first metal pad layer 4 is electrically connected to the mother board and other wiring substrate by way of a solder ball.

Hereinabove, the insulator layer 10 of the multilayer wiring substrate 1 is allowed to have the following material:

1. The first insulator layer 3 is made of the thermosetting resin, while the other part of the insulator layer 10 is made of the light sensitive resin.

2. The insulator layer 10 is substantially entirely made of the thermosetting resin.

Moreover, the first metal pad layer 4 can be so rendered as to become the connector terminal for mounting the electronic parts. In this case, the insulator layer 10 and the wiring layer 11 of the build up layer 50 formed in the step 2 in FIG. 1 have the formation and the wiring pattern upside down.

The method of producing the multilayer wiring substrate 1 is not limited to the one according to the 1st embodiment. Provided that the technical scope is not deviated from that claimed in the claims, modifications and variations of the embodiment will occur to those skilled in the art.

Hereinafter described are other embodiments of the present invention.

—2nd Embodiment—

Figure 2:
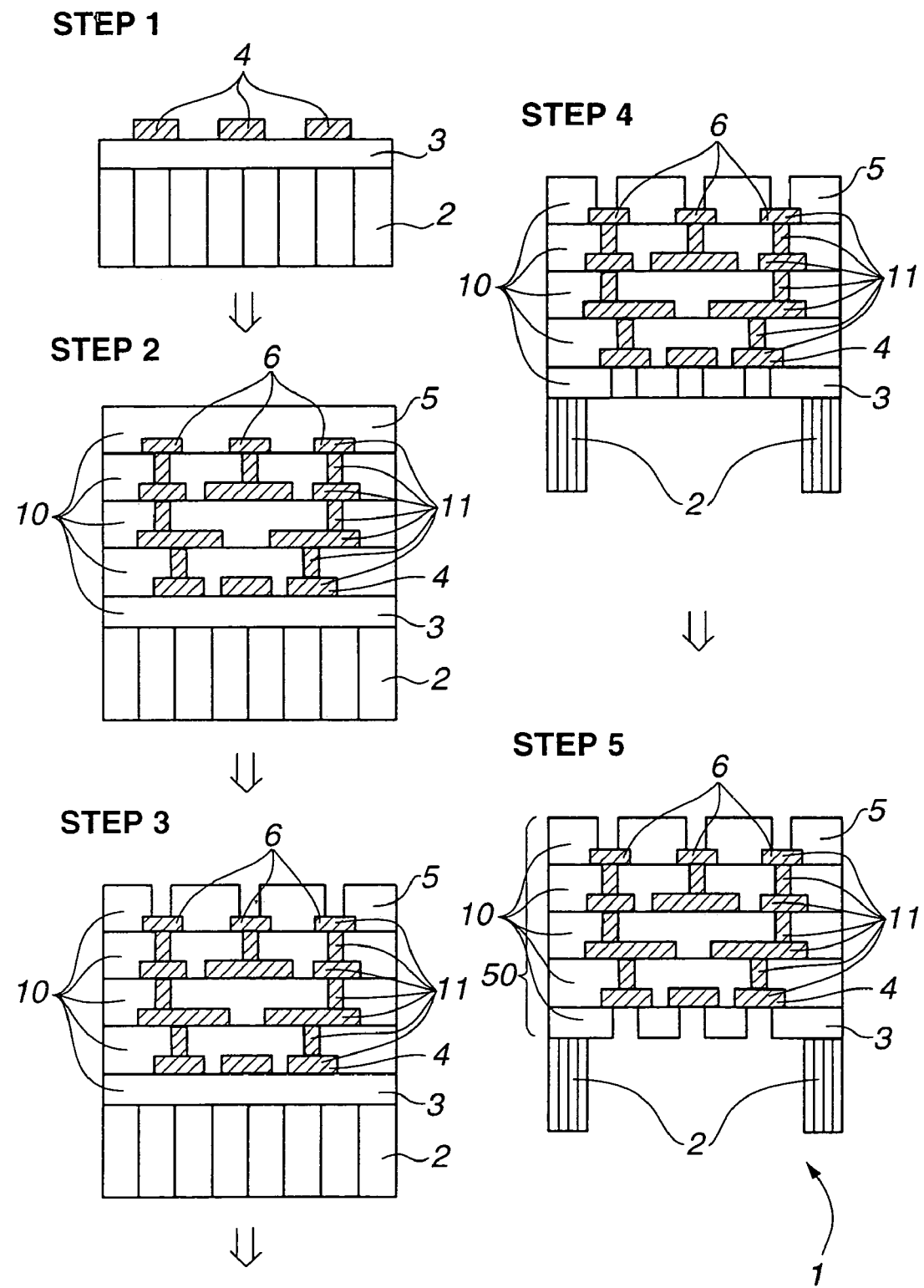
FIG. 2 shows steps of the method of producing the multilayer wiring substrate 1, according to a 2nd embodiment of the present invention.

As is seen in FIG. 2, there is provided a method of producing the multilayer wiring substrate 1 according to a 2nd embodiment of the present invention.

According to the 2nd embodiment, the first metal pad layer 4 becomes the connector terminal for mounting the electronic parts. Being substantially similar to the description of the 1st embodiment, description of the step 1, the step 2 and the step 3 of the 2nd embodiment is basically to be omitted. In the step 2 in FIG. 2 according to the 2nd embodiment, however, the insulator layer 10 and the wiring layer 11 are formed such that the manner and configuration of forming a wiring pattern of the wiring layer 11 are upside down relative to the step 2 in FIG. 1 according to the 1st embodiment.

<Step 4>

The metal supporting plate 2 is subjected to the etching step (etching treatment) with a masking treatment carried out in such a manner that an area constituting the metal supporting plate 2 can be partly removed. Remnant of the metal supporting plate 2 after the etching step is, however, not allowed to stride over an area below the first metal pad layer 4. More specifically, the area is defined as a projected area from a thick part of the first metal pad layer 4 substantially downward.

<Step 5>

Thereafter, open the given position of the first insulator layer 3 in a manner substantially similar to the one disclosed in the step 5 in FIG. 1 according to the 1st embodiment (first opening step).

After the first opening step, the exposed area of each of the first metal pad layer 4 and the second metal pad layer 6 is subjected to the non-electrolytic Ni—P plating (not shown in FIG. 2) and the Au plating (not shown in FIG. 2), thus forming the build up layer 50 including the wiring layer 11 (including the first metal pad layer 4 and the second metal pad layer 6) and the insulator layer 10 (including the first insulator layer 3 and the second insulator layer 5).

The remnant of the metal supporting plate 2 after the etching step in the step 4 in FIG. 2 is to be commonly used as the metal supporting frame body 7 such as the one formed in the step 6 in FIG. 1 according to the 1st embodiment. As a result, the build up layer 50 is formed, thus forming the multilayer wiring substrate 1.

—3rd Embodiment—

Figure 3:
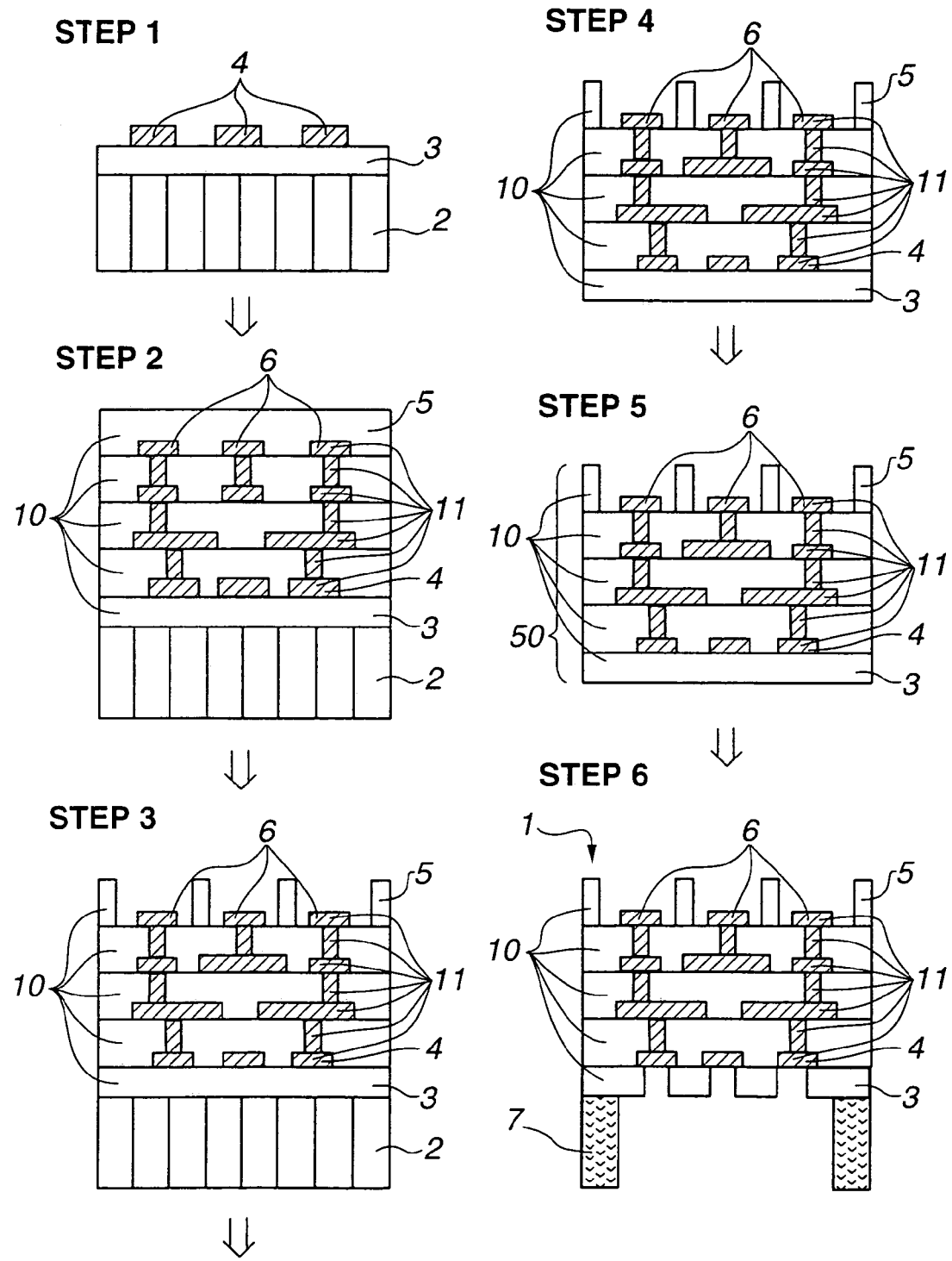
FIG. 3 shows steps of the method of producing the multilayer wiring substrate 1, according to a 3rd embodiment of the present invention.
Figure 4A:
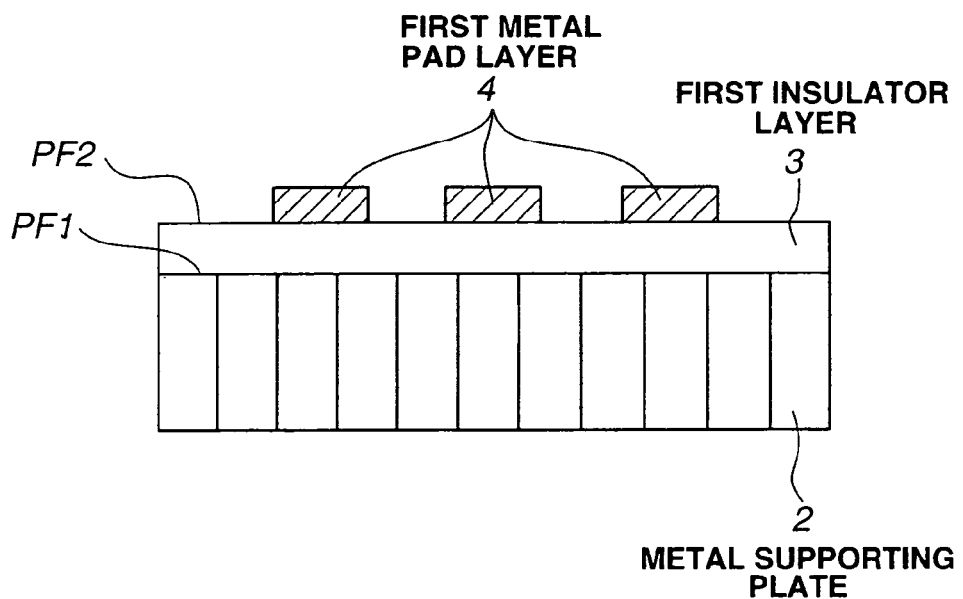
Figure 4A:
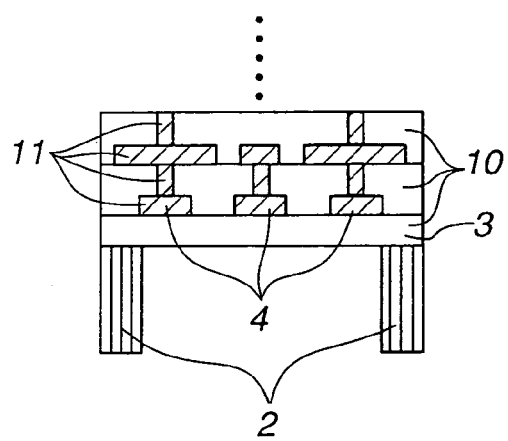
Figure 4A:
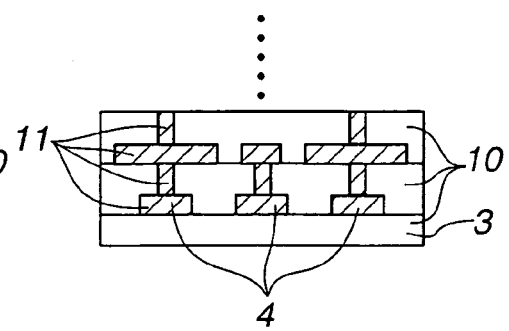
Figure 5:
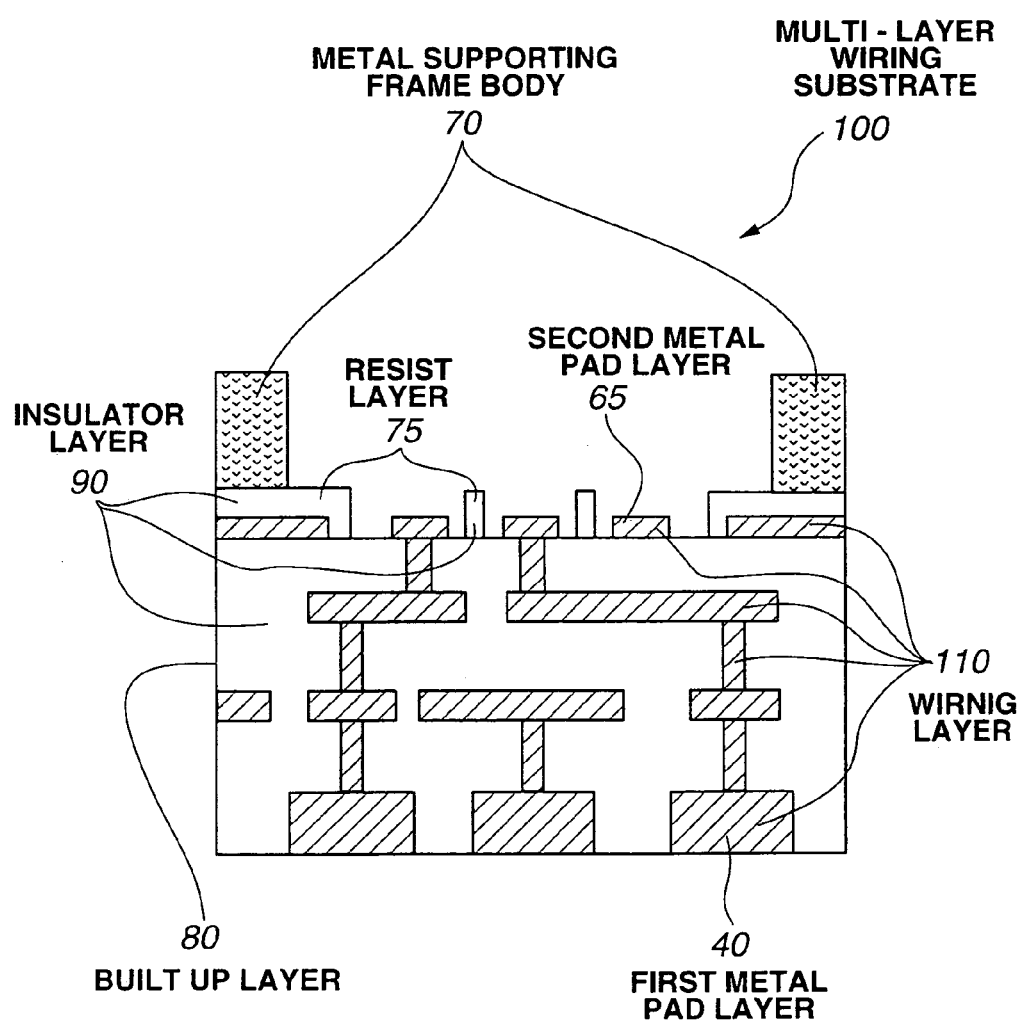
FIG. 5 shows a typical drawing of a multilayer wiring substrate 100, according to a related art.
Figure 6A:
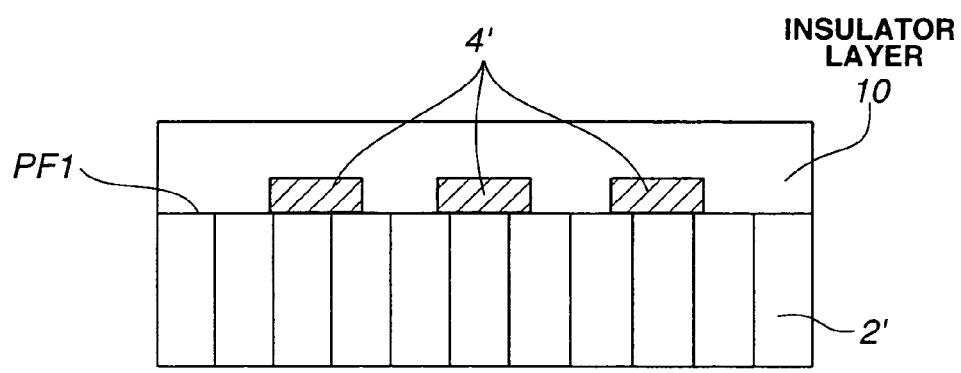
FIG. 6(a) shows a feature of the method of forming an insulator layer 10.
Figure 6A:
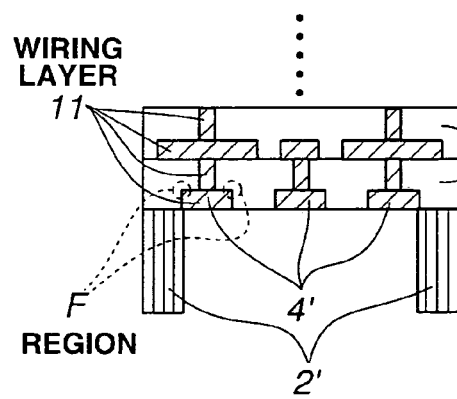
Figure 6A:
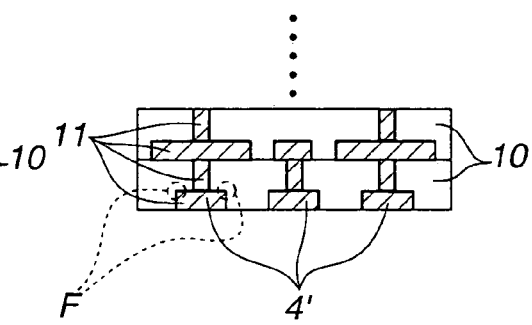

As is seen in FIG. 3, there is provided a method of producing the multilayer wiring substrate 1 according to a 3rd embodiment of the present invention.

Being substantially similar to the description of the 1st embodiment, description of the step 1 and the step 2 of the 3rd embodiment is basically to be omitted. In the step 2 in FIG. 3 according to the 3rd embodiment, however, the second insulator layer 5 has the layer-to-layer insulator film (made of the light sensitive resin) which is not cured, namely, which was not subjected to the cure treatment.

<Step 3>

The second insulator layer 5 is subjected to a patterning treatment with irradiation, exposure and devolvement with ultra violet ray, so as to be formed into the pattern shown in the step 3 in FIG. 3. In or after the pattering treatment, the second insulator layer 5 is subjected to the cure treatment.

Thereafter, step 4, step 5 and step 6 in FIG. 3 according to the 3rd embodiment are substantially similar to those in FIG. 1 according to the 1st embodiment, thereby forming the multilayer wiring substrate 1 at step 6 in FIG. 3. Herein, the first metal pad layer 4 becomes the connector terminal for mounting the electronic parts.

In the multilayer wiring substrate 1 in FIG. 3 according to the 3rd embodiment, the main surface on the second insulator layer 5's side of the second metal pad layer 6 is not coated with the second insulator layer 5. The stress attributable to the external force in the production steps is, in view of production flow, supposed to concentrate most probably on the interface between the first metal pad layer 4 and the first insulator layer 3. For the above reason, the first insulator layer 3 and the first metal pad layer 4 are sequentially laminated on the main surface of the metal supporting plate 2 in the step 1 in FIG. 3. Summarizing the above; provided that the step 1 is secured in FIG. 3, at least the initial object of the present invention is achieved.

EXAMPLE

Hereinafter described is experimental result for checking the effect of the method of producing the multilayer wiring substrate 1 under the present invention.

Example 1

According to the method of producing the multilayer wiring substrate according to the 2nd embodiment, the multilayer wiring substrate as shown in the step 5 in FIG. 2 is produced. An exposed main surface of a first metal pad layer {corresponding to the first metal pad layer 4 in FIG. 2} of the multilayer wiring substrate thus produced is subjected to the non-electrolytic Ni—P plating and the Au plating, thus forming a solder bump on the main surface of the first metal pad layer via the non-electrolytic plating layers. Then, the electronic parts (IC chip) are mounted on the solder bump.

On the other hand, an exposed main surface of a second metal pad layer {corresponding to the second metal pad layer 6 in FIG. 2} of the multilayer wiring substrate thus produced is subjected to the non-electrolytic Ni—P plating and the Au plating, thus forming a solder ball on the main surface of the second metal pad layer via the non-electrolytic plating layers.

An insulator seal resin layer made of an under fill resin 61 is interposed between the electronic parts and the multilayer wiring substrate.

COMPARATIVE EXAMPLE

Figure 7A:
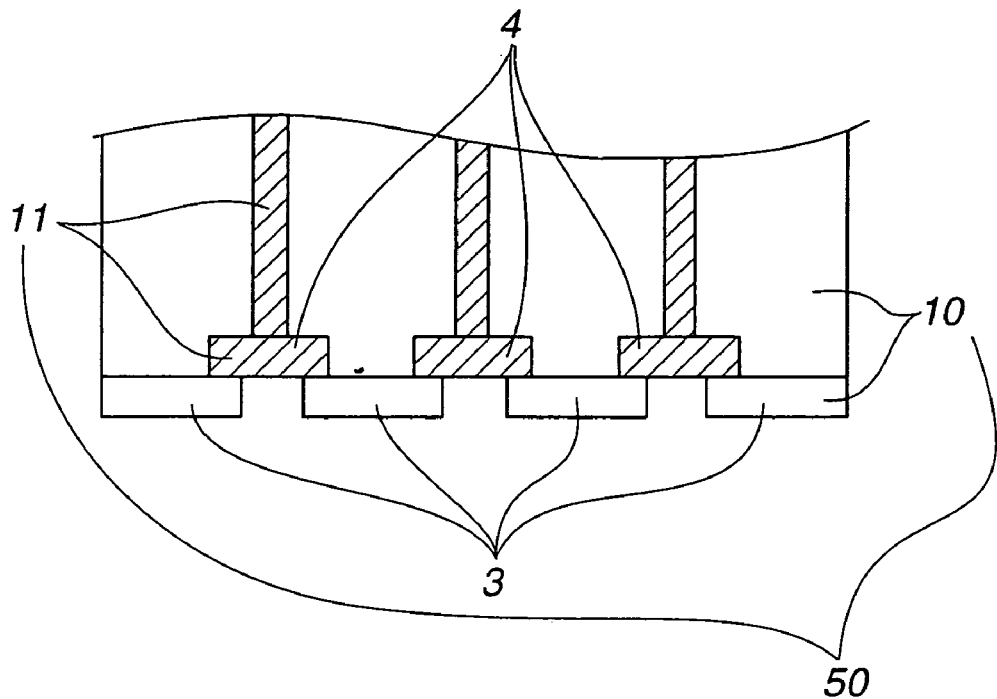
FIG. 7(a) is a typical drawing showing that a main surface on the first insulator layer 3's side of the first metal pad layer 4 includes a coated region coated with the first insulator layer 3 and an exposed region having an exposed surface.
Figure 7B:
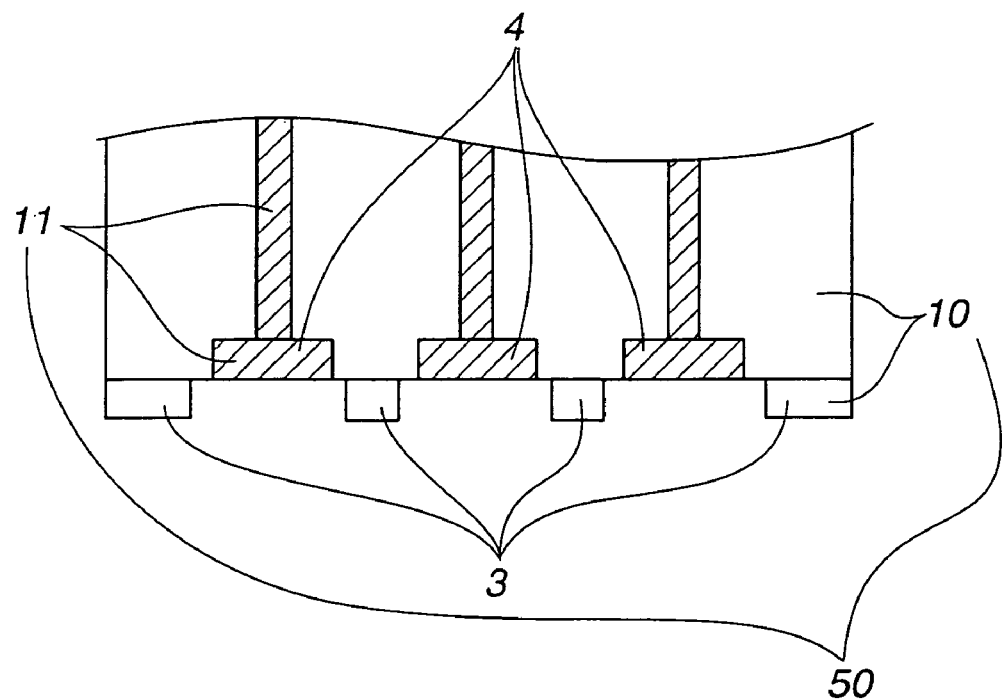
FIG. 7(b) is a typical drawing showing that the main surface on the first insulator layer 3's side of the first metal pad layer 4 is substantially entirely exposed.
Figure 8:
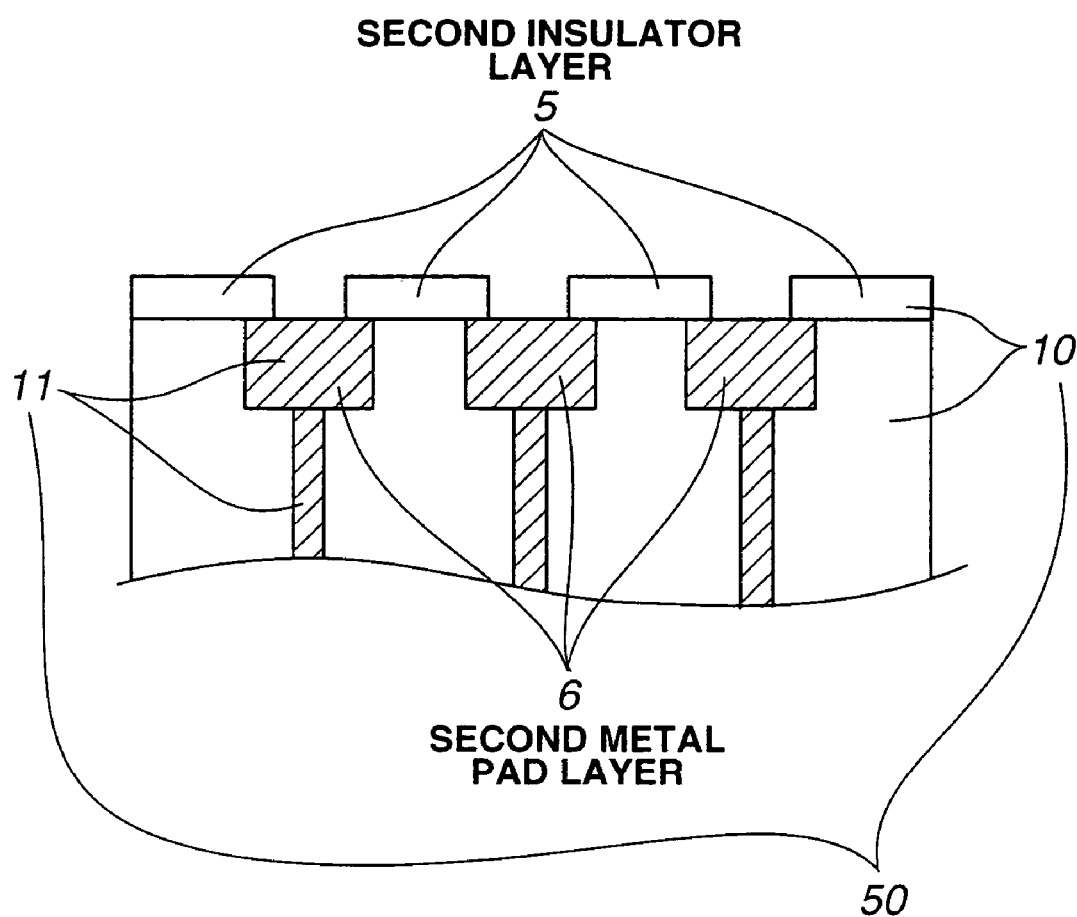
FIG. 8 explains formation of the second insulator layer 5 and the second metal pad layer 6 under the present invention.

In a condition substantially similar to that according to the example 1 above, the multilayer wiring substrate was produced. In this comparative example however, the main surface of each of the first metal pad layer and the second metal pad layer is substantially entirely exposed, as is seen in FIG. 7(b) which shows the first metal pad layer 4.

Figure 9:
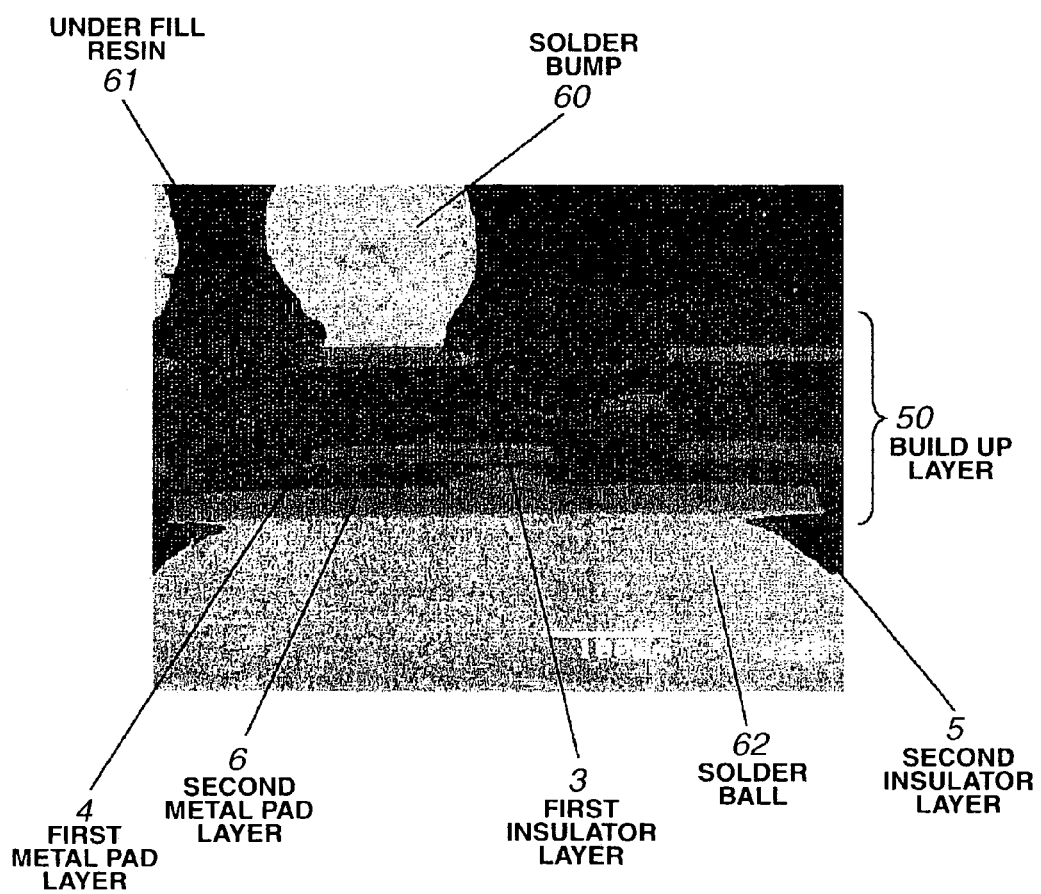
FIG. 9 shows a result of an SEM (=Scanning Electron Microscope) observation, according to an example 1 under the present invention.
Figure 10:
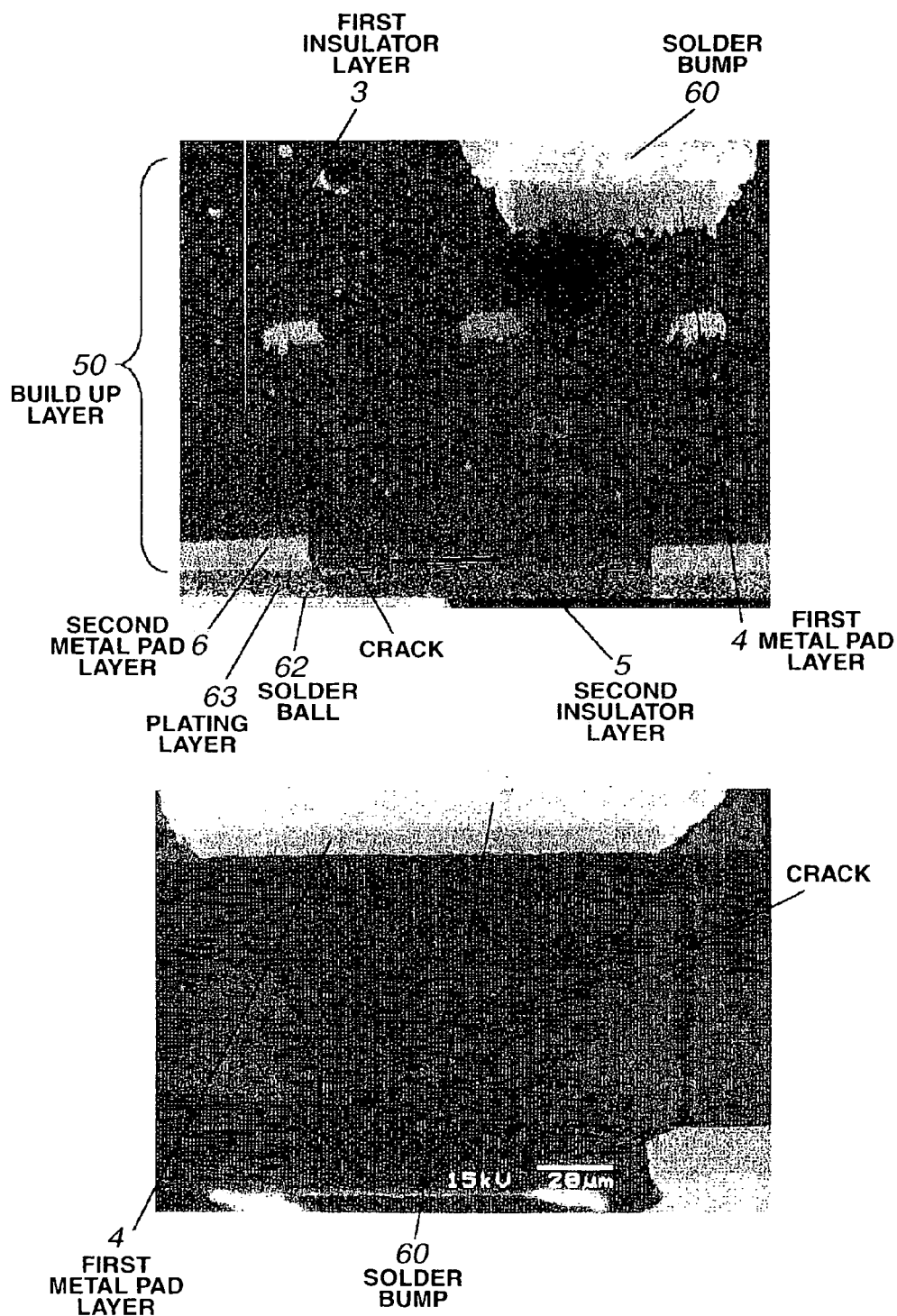
FIG. 10 shows a result of the SEM observation, according to a comparative example under the present invention.

The multilayer wiring substrates produced according to the example 1 and the comparative example as described above were then subjected to an SEM (=Scanning Electron Microscope) for observation of cross section. FIG. 9 shows an observation result of the example 1, while FIG. 10 shows an observation result of the comparative example.

From FIG. 9, the multilayer wiring substrate of the example 1 shows no cracks and the like on the interface between the first metal pad layer 4 and the insulator layer or on the interface between the second metal pad layer 6 and the insulator layer, thus proving that the multilayer wiring substrate is good.

FIG. 10(a) shows an experimental result of area region from the first metal pad layer 4 to the second metal pad layer 6. FIG. 10(b) shows an enlarged view of an area in the vicinity of the first metal pad layer 4. Combining FIG. 10(a) and FIG. 10(b), the multilayer wiring substrate of the comparative example shows cracks on the interface between the first metal pad layer 4 and the insulator layer and on the interface between the second metal pad layer 6 and the insulator layer. The cracks seem to occur due to an excessive stress concentration occurring to the interface between the first metal pad layer 4 and the insulator layer and to the interface between the second metal pad layer 6 and the insulator layer.

Summarizing the results of the example 1 and the comparative example as described above, the main surface of each of the first metal pad layer and the second metal pad layer is supposed to preferably be coated with one of the respective first insulator layer and the second insulator layer, thus forming the multilayer wiring substrate with the cracks effectively suppressed from occurring in the formation of the solder bump 60 or the solder ball 62.

In the method of producing the multilayer wiring substrate of the example 1 and the comparative example, prior to forming the solder bump 60 or the solder ball 62 (in other words, in the step 5 in FIG. 2), no cracks are found on the build up layer by the SEM (for observation of cross section). The above crack-free state proves that the method of producing the multilayer wiring substrate as claimed in claim 1 of the present invention can effectively suppress the cracks from occurring in the production steps.

This application is based on a prior Japanese Patent Application No. P2002-270225 (filed on Sep. 17, 2002 in Japan). The entire contents of the Japanese Patent Application No. P2002-270225 from which priority is claimed is incorporated herein by reference, in order to take some protection against mis-translation or omitted portions.

The scope of the present invention is defined with reference to the following claims.

What is claimed is:

1. A multilayer wiring substrate comprising:
   first and third levels of a metal layer, each of said first and third levels of the metal layer being defined by first and second surfaces opposing to each other and third and fourth surfaces opposing to each other;
   a first insulator layer intervening between said first and third levels of the metal layer, said first level of the metal layer being partially embedded in said first insulator layer such that the second, third and fourth surfaces of said first level of the metal layer are in contact with said first insulator layer while the first surface of said first level of the metal layer forms a substantially flat plane with a surface of said first insulator layer, said third level of the metal layer being formed on said first insulator layer such that the first surface of said third level of the metal layer is in contact with the first insulator layer and the second, third and fourth surfaces of said third level of the metal layer are free from being in contact with the first insulator layer;

a second level of a metal layer embedded into said first insulator layer between said first and third levels of the metal layer;

a second insulator layer formed to cover said substantially flat plane, said second insulator layer having a first opening to expose a part of the first surface of said first level of the metal layer, said part of the first surface of said first level of the metal layer thereby forming a first metal pad;

a third insulator layer formed to cover the second, third and fourth surfaces of said third level of the metal layer and a part of said first insulator layer, said third insulator layer having a second opening to expose a part of the second surfaces of said third level of the metal layer, said part of the second surface of said third level of the metal layer thereby forming a second metal pad.

2. The multilayer wiring substrate, according to claim 1, wherein a first region in which said first metal pad is formed and a second region in which said second metal pad is formed are overlapping with each other.

3. The multilayer wiring substrate, according to claim 1, wherein said first level of the metal layer has a plurality of first metal pads;

said third level of the metal layer has a plurality of second metal pads; and said first metal pads are smaller in pitch therebetween than said second metal pads.

4. The multilayer wiring substrate, according to claim 1, wherein said second insulator layer covers another part of the first surface of said first level of the metal layer.

5. The multilayer wiring substrate, according to claim 1, wherein said second insulator layer is smaller in thickness than said third insulator layer.

6. The multilayer wiring substrate, according to claim 1, wherein said first opening is smaller in area than said second opening.

7. The multilayer wiring substrate, according to claim 1, wherein said first level of the metal layer has a plurality of first metal pads;

said third level of the metal layer has a plurality of second metal pads; and said first metal pads are smaller in pitch therebetween than said second metal pads;

said second insulator is smaller in thickness than said third insulator layer; and said first opening is smaller in area than said second opening.

* * * * *